(12) United States Patent
Isa

(10) Patent No.: US 11,940,482 B2
(45) Date of Patent: Mar. 26, 2024

(54) INSPECTION DEVICE

(71) Applicant: NIDEC READ CORPORATION, Kyoto (JP)

(72) Inventor: Takashi Isa, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 95 days.

(21) Appl. No.: 17/785,920

(22) PCT Filed: Dec. 1, 2020

(86) PCT No.: PCT/JP2020/044609
§ 371 (c)(1),
(2) Date: Jun. 16, 2022

(87) PCT Pub. No.: WO2021/124862
PCT Pub. Date: Jun. 24, 2021

(65) Prior Publication Data
US 2023/0024921 A1 Jan. 26, 2023

(30) Foreign Application Priority Data
Dec. 20, 2019 (JP) .................. 2019-230178

(51) Int. Cl.
*G01R 31/28* (2006.01)

(52) U.S. Cl.
CPC ..... *G01R 31/2808* (2013.01); *G01R 31/2887* (2013.01); *G01R 31/2891* (2013.01); *G01R 31/2893* (2013.01)

(58) Field of Classification Search
CPC ............ G01R 31/2808; G01R 31/2887; G01R 31/2891; G01R 31/2893; G01R 31/2867; H05K 3/00; H05K 2203/16
See application file for complete search history.

(56) References Cited

U.S. PATENT DOCUMENTS

| 5,410,259 A | * | 4/1995 | Fujihara | G01R 31/2887 324/755.11 |
| 5,648,729 A | | 7/1997 | Yamauchi et al. | |
| 5,955,876 A | | 9/1999 | Yamauchi et al. | |
| 2015/0226767 A1 | * | 8/2015 | Akiyama | G01R 1/07314 324/756.03 |

FOREIGN PATENT DOCUMENTS

| JP | 2002131359 A | 5/2002 |
| JP | 2015036625 A | 2/2015 |
| WO | 2019130949 A1 | 7/2019 |

* cited by examiner

*Primary Examiner* — G. M. A. Hyder
(74) *Attorney, Agent, or Firm* — Viering, Jentschura & Partner mbB

(57) ABSTRACT

An upper mechanism including a table provided with a placement surface of an inspection target, a lower mechanism configured to rotatably support the upper mechanism, and a lifting operation unit configured to be supported by the upper mechanism so as to be movable up and down are provided. The lower mechanism includes a rotation drive unit configured to rotate the upper mechanism, and a push-up force output unit configured to lift and lower the lifting operation unit. A transmission member with which a tip of the push-up force output unit can contact or separate is provided at a lower end of the lifting operation unit.

11 Claims, 11 Drawing Sheets

INSPECTION DEVICE

CROSS-REFERENCE TO RELATED APPLICATIONS

This is a U.S. national Stage Application, filed under 35 U.S.C. § 371, of International Application No. PCT/JP2020/044609, filed on Dec. 1, 2020, and claims priority under 35 U.S.C. § 119(a) and 35 U.S.C. § 365(b) from Japanese Patent Application No. 2019-230178, filed on Dec. 20, 2019; the disclosures of which are incorporated herein by reference.

FIELD

Various embodiments of the present disclosure relate to an inspection device that inspects an inspection target such as a substrate.

BACKGROUND

Conventionally, there has been known a printed circuit board in which wiring patterns are formed point-symmetrically on the same plane. In order to inspect such a printed circuit board, there is known a printed circuit board inspection device that inspects conduction or insulation between an inspection pin and a wiring formed on an upper surface of a printed circuit board by bringing the inspection pin provided on an upper inspection jig into contact with the wiring while the printed circuit board placed on a flat plate-shaped tray is sandwiched between the upper inspection jig and the lower inspection jig.

The printed circuit board inspection device is provided with a board reversing unit that reverses the direction of the printed circuit board placed on the tray. After the wiring pattern in a certain direction formed on the printed circuit board is inspected, for example, the direction of the printed circuit board is changed by rotating the table on which the tray is placed by 180 degrees, and the wiring of the printed circuit board placed on the tray is inspected in the same procedure as the forward direction for the wiring pattern in the reverse direction.

Meanwhile, in the case of rotating the table as described above, if the weight of the table is heavy, the load on the rotation drive unit that rotates the table increases. On the other hand, in order to enhance the function of the table, the weight may increase in order to realize the function.

SUMMARY

An inspection device according to an exemplary embodiment of the present disclosure includes an upper mechanism including a table on which a placement surface of the inspection target is provided, a lower mechanism that rotatably supports the upper mechanism, and a lifting operation unit supported by the upper mechanism so as to be movable up and down. The lower mechanism includes a rotation drive unit configured to rotate the upper mechanism, and a push-up force output unit aligned so as to face the lifting operation unit and configured to lift and lower the lifting operation unit. The lifting operation unit is disposed at a position facing the push-up force output unit when a rotation angle of the upper mechanism with respect to the lower mechanism is a preset setting angle. A transmission member with which a tip of the push-up force output unit can contact or separate is provided at a lower end of the lifting operation unit.

The inspection device according to an exemplary embodiment of the present disclosure further includes a conveyance mechanism configured to convey the inspection target, a control unit configured to control the push-up force output unit and the conveyance mechanism, and an inspection unit configured to inspect the inspection target placed on the placement surface. The conveyance mechanism includes an inspection target holding portion configured to hold the inspection target. The control unit is configured to execute: control in which the push-up force output unit is operated to cause the upper end of the protruding rod to protrude to the push-up position; control in which the conveyance mechanism is operated to cause the inspection target to be held by the inspection target holding portion; control in which the inspection target is conveyed above the placement surface to be placed on the upper end of the protruding rod, and control in which the inspection target holding portion is retracted from below the inspection target; and control in which the operation of the push-up force output unit is stopped to lower the upper ends of the plurality of protruding rods to the retracted position to place the inspection target on the placement surface.

The above and other elements, features, steps, characteristics and advantages of the present disclosure will become more apparent from the following detailed description of exemplary embodiments with reference to the attached drawings.

BRIEF DESCRIPTION OF THE DRAWINGS

In the drawings, like reference characters generally refer to the same parts throughout the different views. In the drawings, components given the same reference numerals denote the same components, and description thereof will be omitted. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
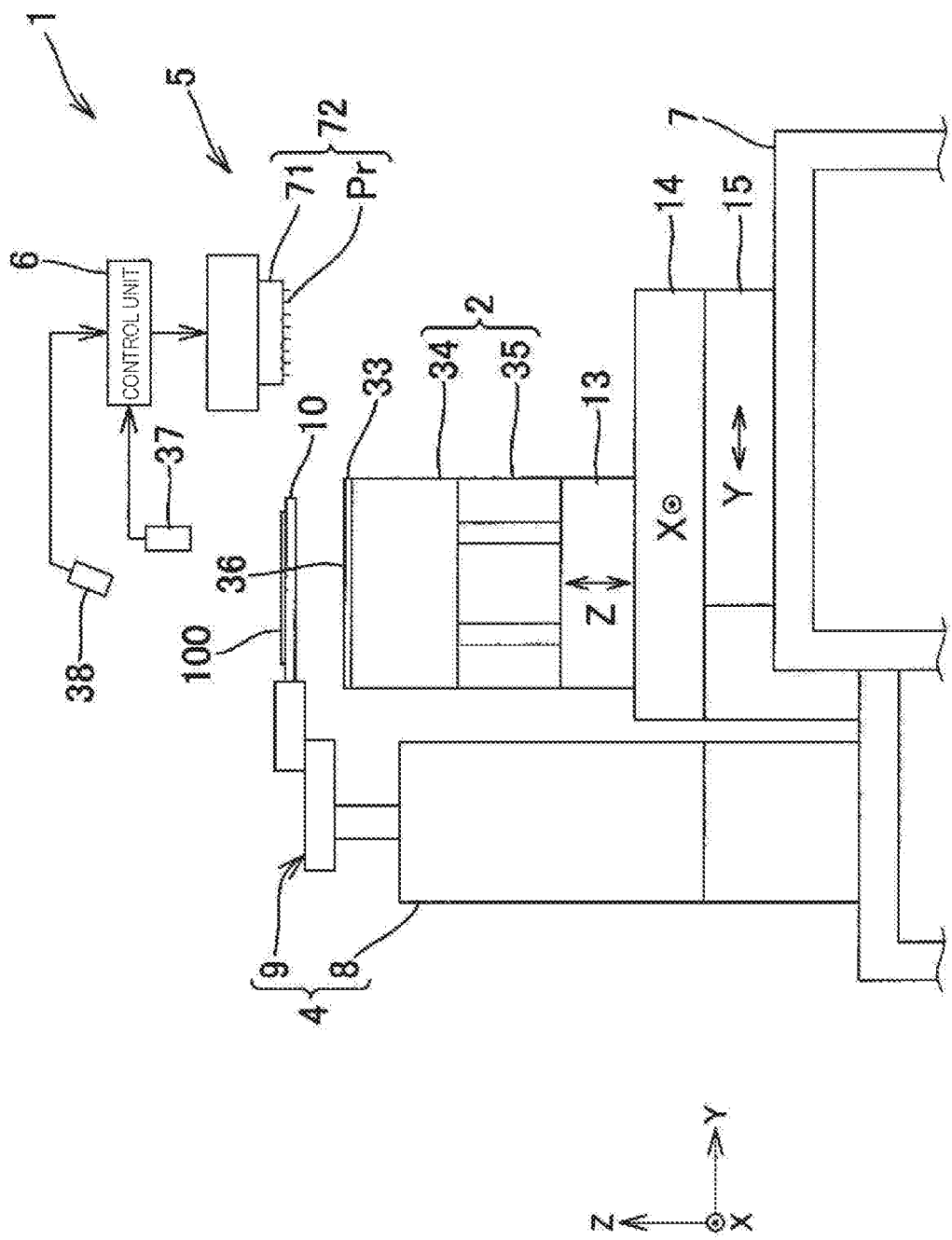
FIG. 1 is an explanatory diagram illustrating a configuration of an inspection device according to an exemplary embodiment of the present disclosure.

An exemplary embodiment of the present disclosure will be described below with reference to drawings. Note that configurations with the same reference numerals in the drawings indicate the same configurations and are omitted from description.

An inspection device 1 illustrated in FIG. 1 generally includes a placement table 2 of an inspection target 100, a conveyance mechanism 4, an inspection unit 5, a control unit 6, and a support frame 7 that supports these components. In each drawing, XYZ orthogonal coordinate axes are appropriately illustrated in order to clarify the directional relationship as necessary. The Z direction corresponds to the height direction of the placement table 2. The X direction corresponds to the depth direction of the placement table 2 orthogonal to the paper surface of FIG. 1. The Y direction corresponds to the width direction of the placement table 2 extending in the left-right direction in FIG. 1.

The inspection unit 5 includes an inspection jig 72 that includes a rod-shaped probe Pr having conductivity and a support member 71 supporting a plurality of probes Pr.

The conveyance mechanism 4 includes a base portion 8 and a conveyance drive unit 9 having a conventionally known robot arm and the like supported by the base portion 8. An inspection target holding portion 10 including a holding plate or a clamping claw having a substantially fork shape or a flat plate shape is provided at a tip portion of the conveyance drive unit 9.

The conveyance drive unit 9 has a function of horizontally moving and vertically moving the inspection target holding portion 10. When the inspection target 100 is inspected, the inspection target 100 is taken out from a supply cassette (not illustrated) and conveyed onto the placement table 2 by the conveyance mechanism 4. After completion of the inspection of the inspection target 100, the inspection target 100 is taken out from the placement table 2 by the conveyance mechanism 4 and carried out to an installation portion of a storage cassette (not illustrated).

A first moving mechanism 13 including a lifting drive mechanism or the like that lifts and lowers the placement table 2 in the Z direction is provided below the placement table 2. A second moving mechanism 14 including a screw feeding mechanism or the like that moves the placement table 2 and the first moving mechanism 13 in the X direction is provided below the first moving mechanism 13. Further, a third moving mechanism 15 including a screw feeding mechanism that moves the placement table 2, the first moving mechanism 13, and the second moving mechanism 14 in the Y direction is provided below the second moving mechanism 14.

The placement table 2 includes an upper mechanism 34 having a table 33 on which the inspection target 100 is placed, and a lower mechanism 35 disposed below the upper mechanism 34. An alignment camera 37 and a laser displacement meter 38 are disposed above the placement table 2. The alignment camera 37 and the laser displacement meter 38 have a function of detecting a placement position, a placement angle, and the like of the inspection target 100 placed on the table 33.

The control unit 6 has a function of determining whether the placement position and the placement angle of the inspection target 100 placed on the table 33 are appropriate according to detection signals of the alignment camera 37 and the laser displacement meter 38. According to the determination result, the control unit 6 performs control to finely adjust the placement position and the like of the inspection target 100.

Figure 2:
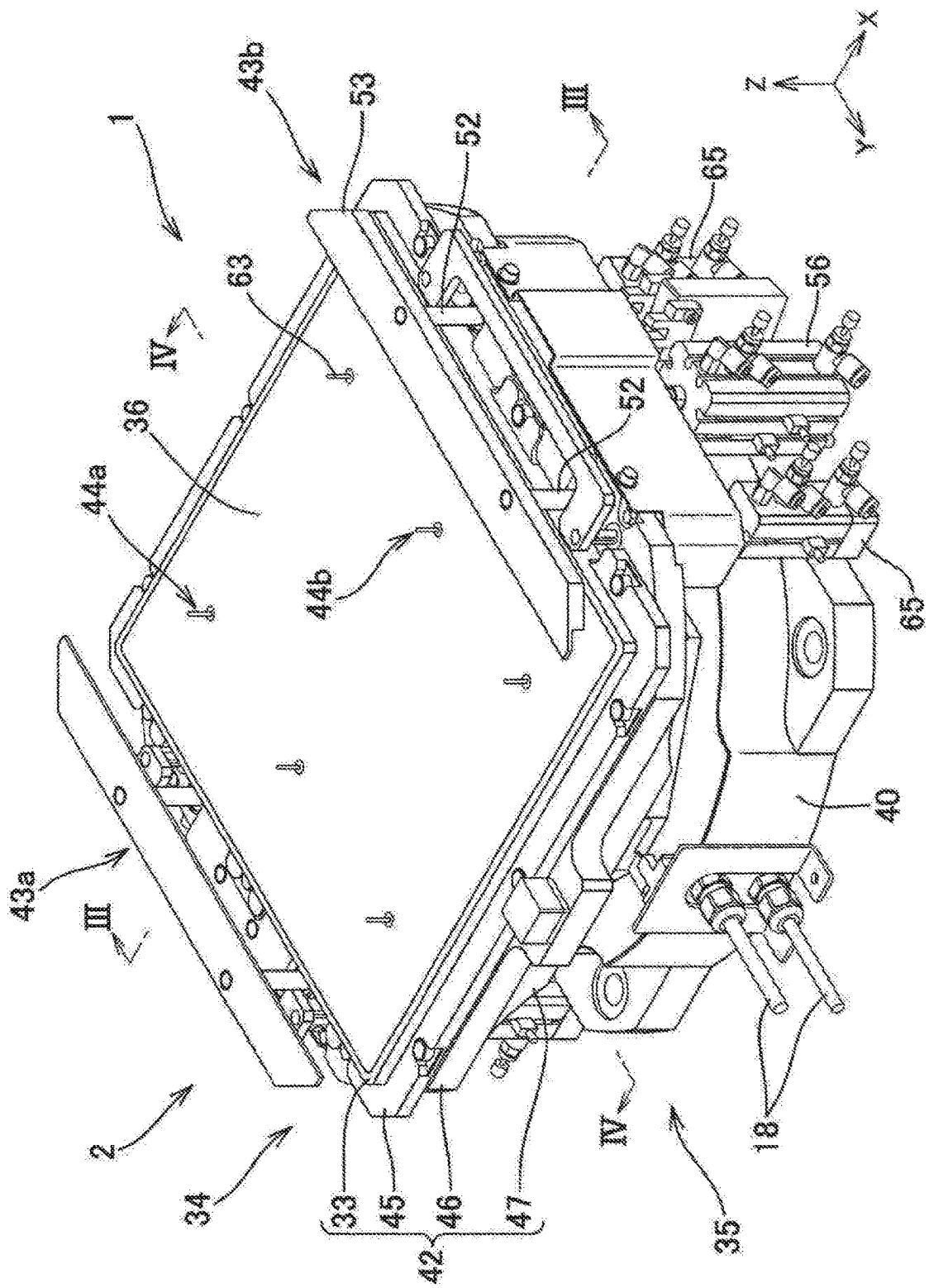
FIG. 2 is a perspective view illustrating a configuration of a placement table of the inspection device.
Figure 3:
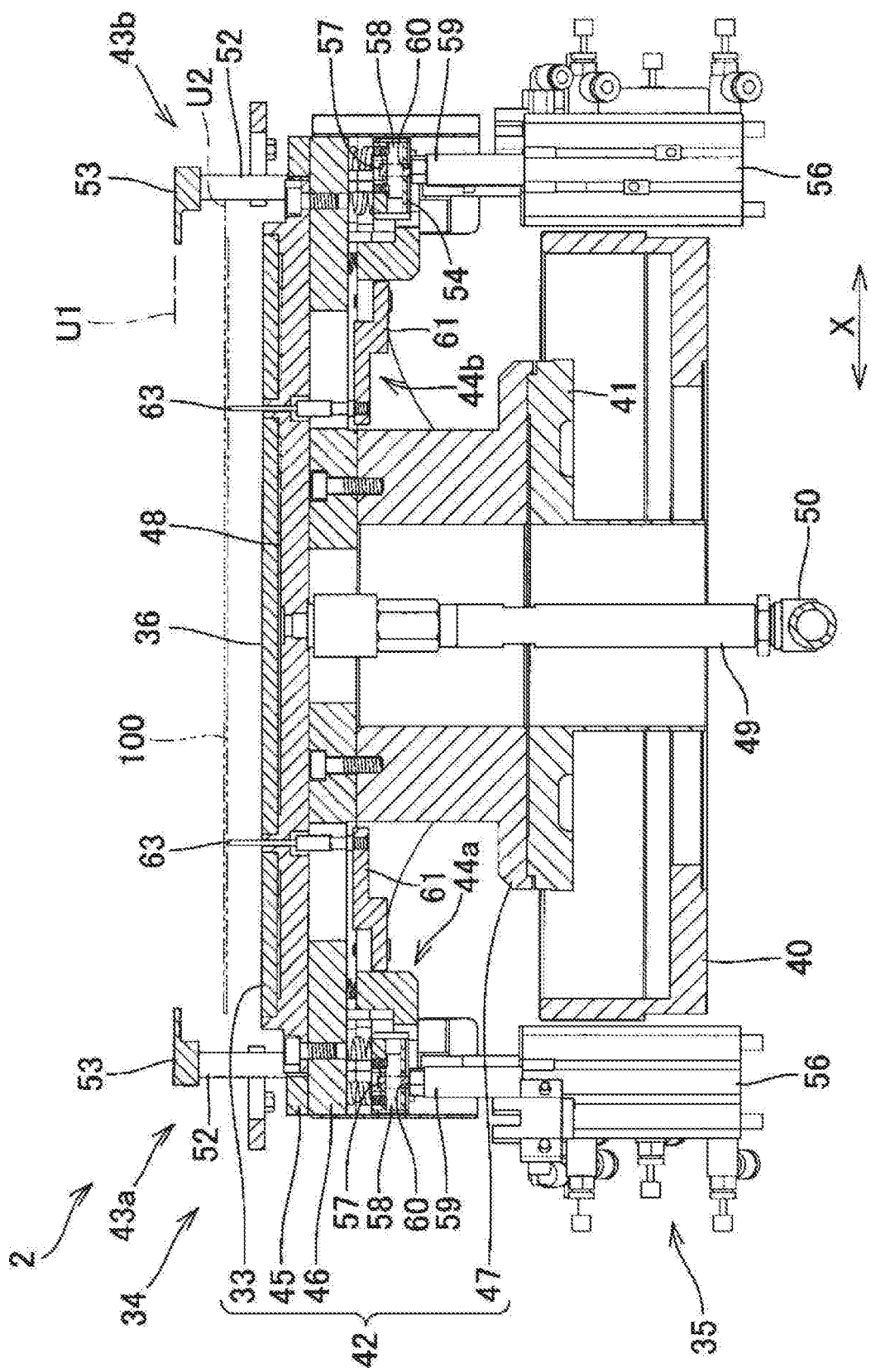
FIG. 3 is a cross-sectional view taken along line III-III of FIG. 2.

As illustrated in FIG. 2, the upper mechanism 34 includes an upper body 42 that is rotationally driven by a rotation drive unit 40 provided in the lower mechanism 35, and first lifting operation units 43a and 43b and second lifting operation units 44a and 44b that are supported so as to be movable up and down by the upper body 42. In FIGS. 2 and 3, the first lifting operation unit located on one side of the placement table 2 is denoted by reference numeral 43a, and the first lifting operation unit located on the other side of the placement table 2 is denoted by reference numeral 43b. The second lifting operation unit located on one side of the placement table 2 is denoted by reference numeral 44a, and the second lifting operation unit located on the other side of the placement table 2 is denoted by reference numeral 44b.

The upper body 42 includes a table 33 having a placement surface 36 of the inspection target 100, a support plate 45 that supports the table 33, an intermediate plate 46 fixed to the lower surface of the support plate 45, and a rotating body 47 fixed to the lower surface of the intermediate plate 46 (see FIG. 3). Then, the rotating body 47 is rotationally driven by the rotation drive unit 40. Thus, the table 33 is configured to rotate, for example, 180 degrees in a plan view.

An upper end of a suction pipe 49 that sucks air in a gap 48 provided between the support plate 45 and the table 33 is attached to the support plate 45. A rotary joint 50 is provided at a lower end of the suction pipe 49. A pipe 19 communicating with a vacuum device (not illustrated) is connected to the rotary joint 50. Suction pores (not illustrated) for attracting the inspection target 100 onto the placement surface 36 according to a suction force of the vacuum device are formed in the table 33.

Figure 5:
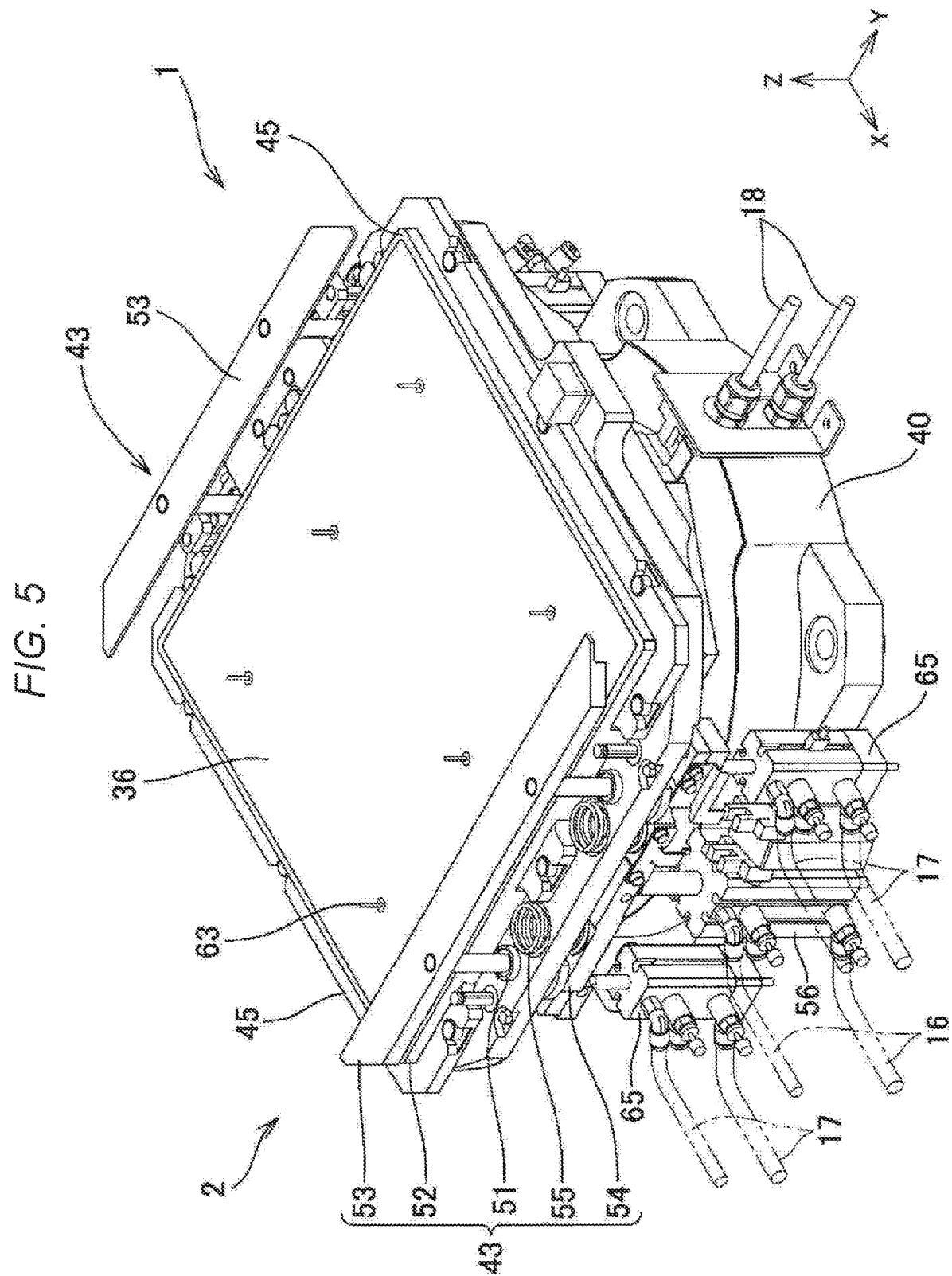
FIG. 5 is a perspective view illustrating a state in which the placement table is viewed from an angle different from that in FIG. 2.
Figure 6:
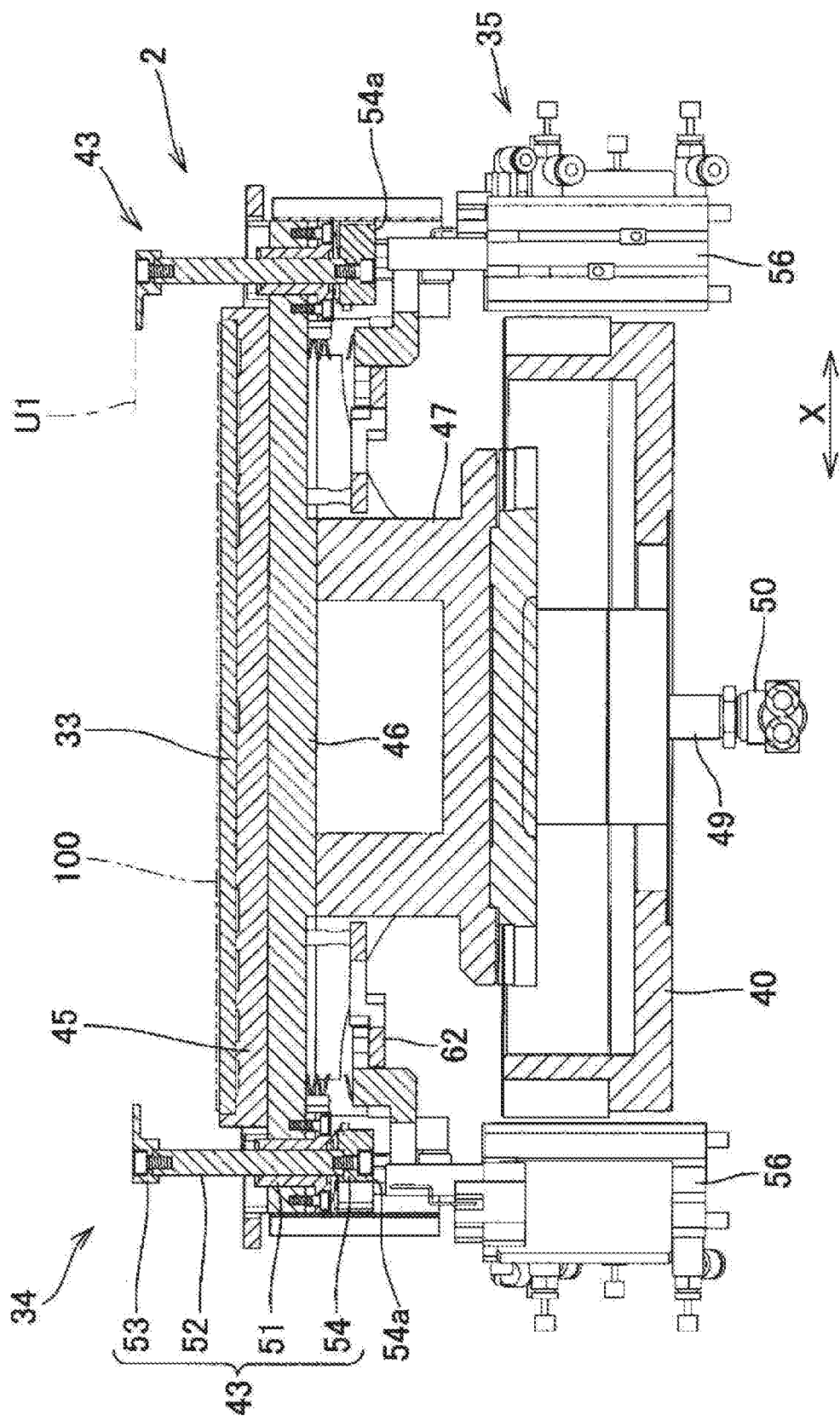
FIG. 6 is a cross-sectional view taken along line VI-VI of FIG. 4.

As illustrated in FIGS. 5 and 6, the first lifting operation unit 43 includes a guide bush 51 provided on the intermediate plate 46 and a pair of lifting bars 52 supported so as to be movable up and down by the guide bush 51. A pressing member 53 is fixed to the upper end of the lifting bar 52. A lower plate 54 is fixed to the lower end of the lifting bar 52. A biasing member 55 including a compression coil spring or the like is disposed between the lower plate 54 and the support plate 45 of the upper body 42. The biasing member 55 presses the lower plate 54 downward to bias the pressing member 53 in a direction to be pressed down to a pressing position S1 illustrated in FIG. 8.

Figure 7:
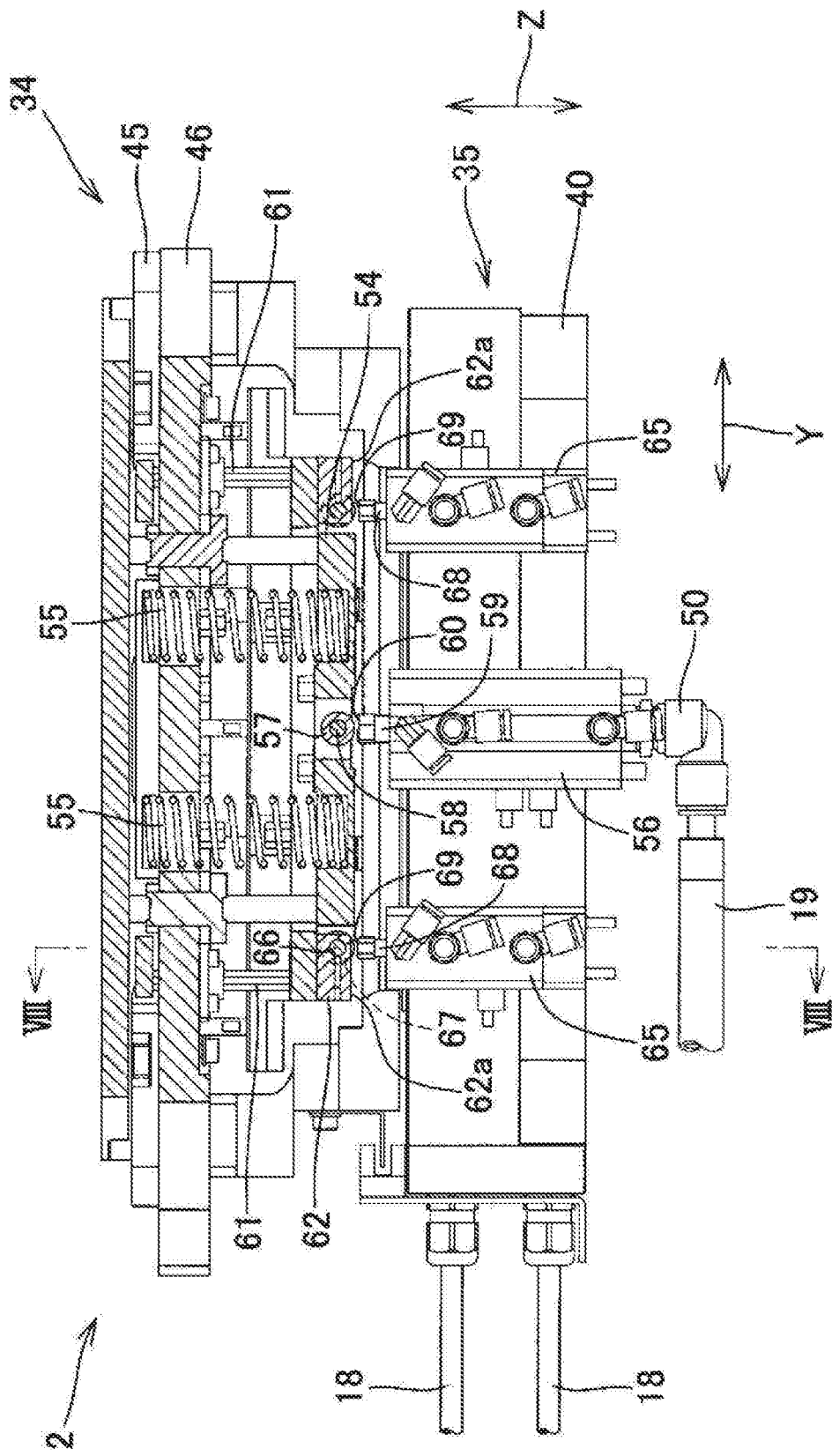
FIG. 7 is a cross-sectional view illustrating a lowered state of the pressing member.

As illustrated in FIGS. 3 and 7, a transmission member 57 with which a tip of a push-up force output unit 59 provided in the lower mechanism 35 can contact or separate is disposed at a lower end of the first lifting operation unit 43. The transmission member 57 is formed of a material harder than the lower surface of the upper mechanism 34 generally formed of soft iron steel, specifically, a lower surface 54a of the lower plate 54 illustrated in FIG. 6. For example, the transmission member 57 is formed of a roller member made of a high carbon chromium bearing steel material or the like quenched at a predetermined temperature. The transmission member 57 formed of a roller member is rotatably supported around a shaft 58 orthogonal to the lifting direction of the first lifting operation unit 43. The shaft 58 is formed of a material harder than the lower surface of the upper mechanism 34, for example, a material obtained by quenching carbon steel for machine structure made of S45C at a predetermined temperature. FIG. 7 is a cross-sectional view at a position different from FIG. 6, and illustrates a state in which the tip of the push-up force output unit 59 is separated from the transmission member 57.

The push-up force output unit 59 outputs a pressing force for raising the first lifting operation unit 43. In the present embodiment, for example, a piston rod of an air cylinder 56 installed in the Z direction of FIG. 7 constitutes the push-up force output unit 59. Then, the push-up force output unit 59 rises according to the driving air supplied from the air source (not illustrated) to the air cylinder 56, and protrudes from the air cylinder 56. As a result, the tip of the push-up force output unit 59 comes into contact with the lower surface of the transmission member 57. As illustrated in FIG. 7, the tip of the push-up force output unit 59 is formed in a flat surface 60 extending in a direction orthogonal to the lifting direction of the first lifting operation unit 43. The push-up force output unit 59 is not limited to the piston rod that is lifted and lowered by the air cylinder 56. For example, the push-up force output unit 59 may be configured by a push-pull solenoid or a push rod lifted and lowered by a push-pull motor.

When the tip of the push-up force output unit 59 comes into contact with the transmission member 57, a push-up force for pushing up the lower plate 54 and the lifting bar 52 is applied to the transmission member 57 via the transmission member 57. As a result, as illustrated in FIG. 6, the pressing member 53 is pushed up to a raised position U1 above the inspection target 100 placed on the placement surface 36 of the table 33.

Figure 8:
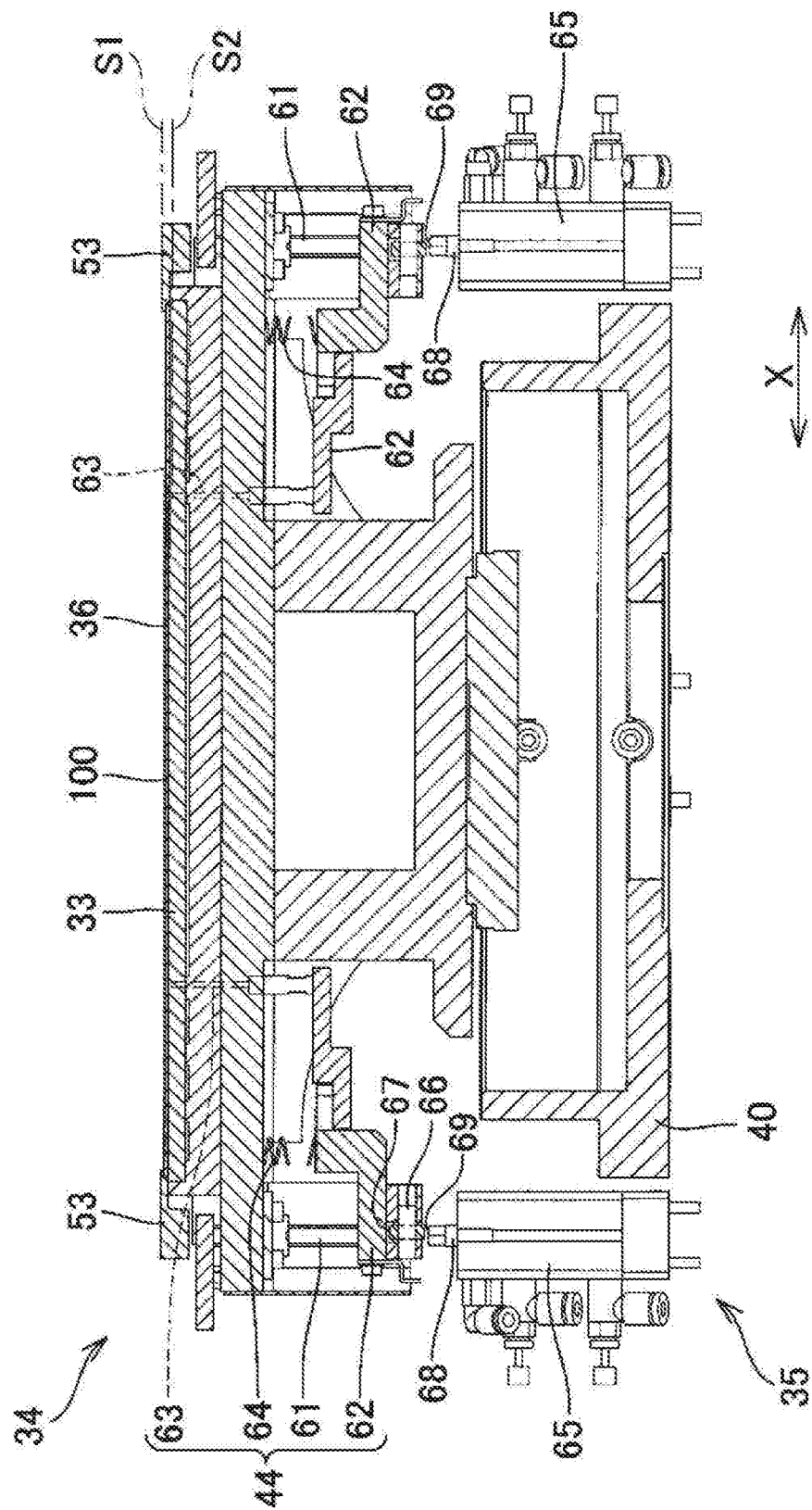
FIG. 8 is a cross-sectional view taken along line VIII-VIII in FIG. 7.
Figure 9:
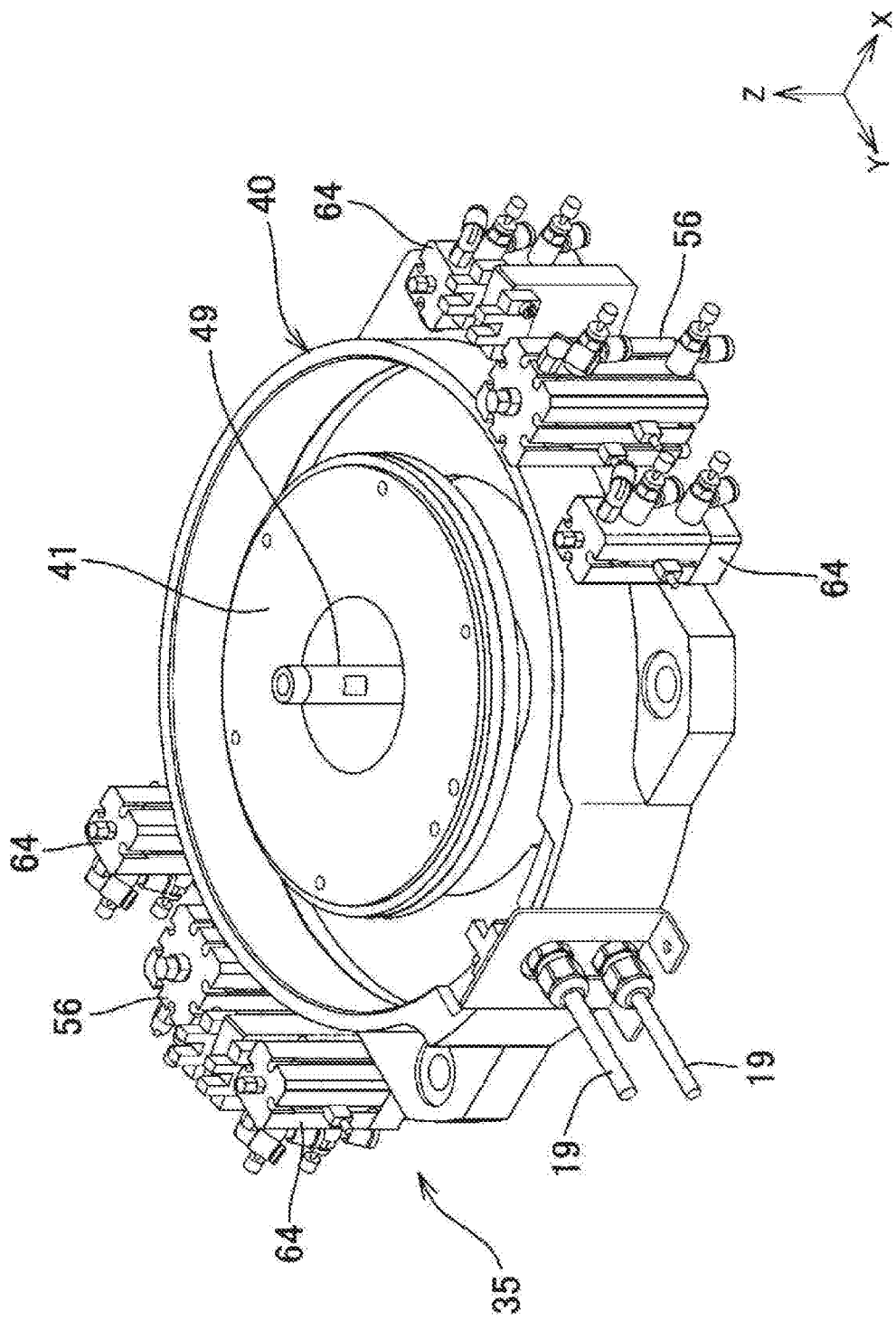
FIG. 9 is a perspective view illustrating a specific configuration of a lower mechanism.

On the other hand, when the supply of the driving air to the air cylinder 56 is stopped, the tip of the push-up force output unit 59 is separated from the lower surface of the transmission member 57. Then, the pressing member 53 is pushed down to the lower pressing position S1 (see FIG. 8) by the biasing force of the biasing member 55. As a result, as illustrated in FIG. 8, the end portion of the inspection target 100 placed on the placement surface 36 of the table 33 is pressed onto the placement surface 36 via the pressing member 53. As a result, when warpage occurs in the inspection target 100, the warpage is corrected.

That is, depending on the material of the inspection target 100, warpage may easily occur in the inspection target 100. The warpage of the inspection target 100 can be corrected to some extent by sucking air from the suction pores provided in the table 33 and bringing the inspection target 100 into close contact with the placement surface 36. However, for example, in a case where warpage occurs such that the end portion is separated from the placement surface 36 with respect to the central portion of the inspection target 100, it is difficult to correct the warpage only with the above-described suction force. In such a case, the warpage of the inspection target 100 can be effectively corrected by using the pressing force of the pressing member 53.

As illustrated in FIG. 8, the second lifting operation unit 44 includes a lifting plate 62 supported so as to be movable up and down along a lifting bar 61, a plurality of protruding rods 63 protruding upward from the tip portion of the lifting plate 62, and a biasing member 64 including a compression coil spring that urges the lifting plate 62 downward.

At the lower end portion of the second lifting operation unit 44, a transmission member 67 is disposed in which a tip of a push-up force output unit 68 provided in the lower mechanism 35 can come into contact with or separate from. Specifically, a shaft 66 orthogonal to the lifting direction of the second lifting operation unit 44 is provided at a position facing the push-up force output unit 68. The transmission member 67 is constituted by a roller member such as a roller bearing rotatably supported around the shaft 66. Similarly to the transmission member 57 and the shaft 58 of the first lifting operation unit 43, the transmission member 67 and the shaft 66 are formed of a material harder than the lower surface of the upper mechanism 34, specifically, a lower surface 62a of the lifting plate 62 illustrated in FIG. 7. FIG. 7 illustrates a state in which the tip of the push-up force output unit 68 is separated from the transmission member 67.

The push-up force output unit 68 outputs a pressing force for raising the second lifting operation unit 44. In the present embodiment, for example, a piston rod of an air cylinder 65 installed in the Z direction of FIG. 7 constitutes the push-up force output unit 68. Then, the push-up force output unit 68 protrudes from the air cylinder 65 according to the driving air supplied from the air source (not illustrated) to the air cylinder 65. As a result, the tip of the push-up force output unit 68 comes into contact with the lower surface of the transmission member 67. As illustrated in FIG. 7, the tip of the push-up force output unit 68 is formed in a flat surface 69 extending in a direction orthogonal to the lifting direction of the second lifting operation unit 44.

When the tip of the push-up force output unit 68 comes into contact with the transmission member 67, a pressing force for pushing up the lifting plate 62 and the protruding rod 63 via the transmission member 67 is applied to the transmission member 67. As a result, as illustrated in FIG. 3, the upper end of the protruding rod 63 penetrates the table 33 and the support plate 45 and protrudes to a push-up position U2 above the placement surface 36.

On the other hand, when the supply of the driving air to the air cylinder 56 is stopped, the tip of the push-up force output unit 68 is separated from the lower surface of the transmission member 67. Then, the upper end of the protruding rod 63 is pushed down to a retracted position S2 (see FIG. 8) on the lower side according to the biasing force of the biasing member 64. As a result, as illustrated in FIG. 8, the upper end of the protruding rod 63 is retracted downward from the placement surface 36 of the table 33. The push-up force output unit 68 is not limited to the piston rod that is lifted and lowered by the air cylinder 65. For example, the push-up force output unit 68 may be configured by a push-pull solenoid or a push rod lifted and lowered by a push-pull motor.

Figure 4:
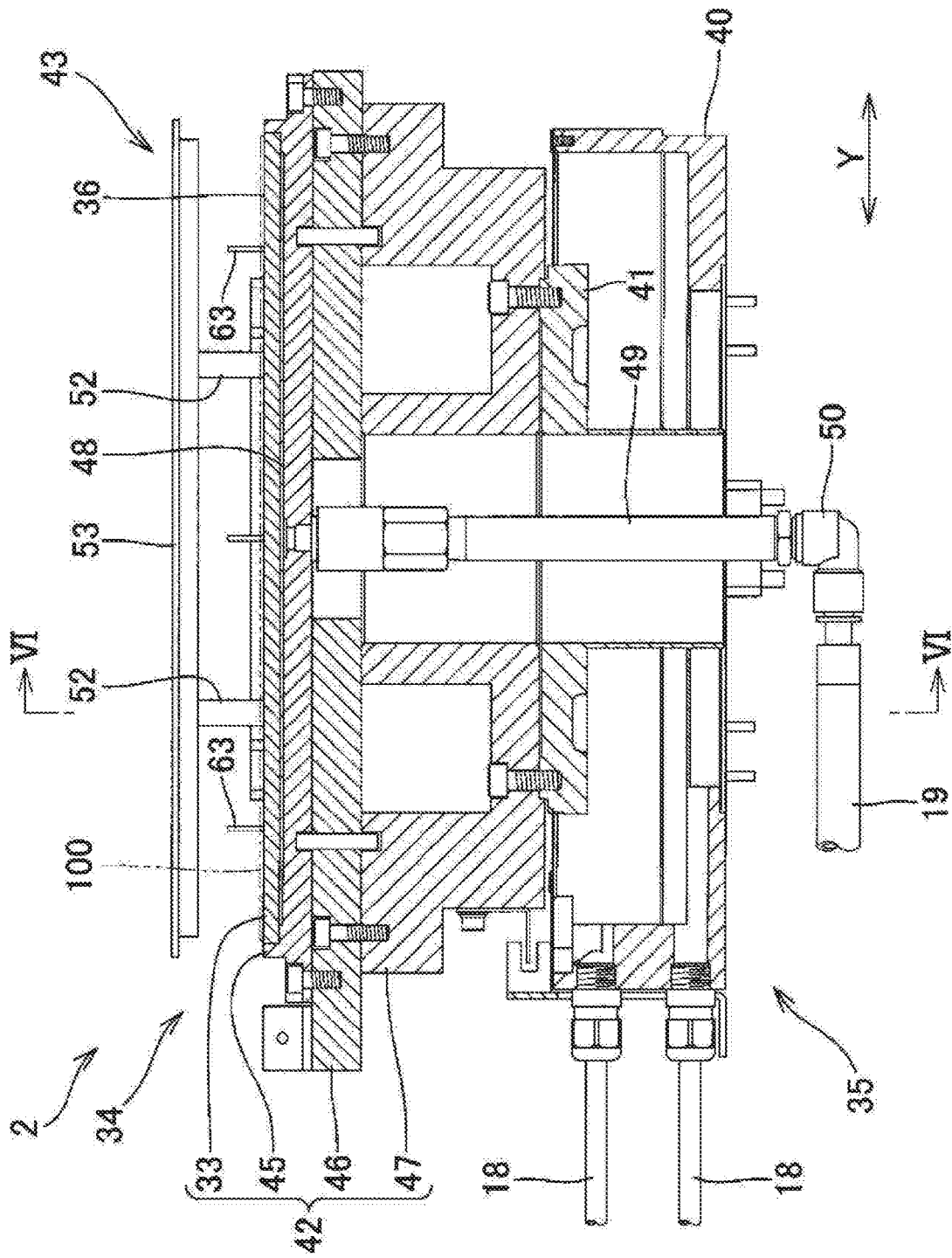
FIG. 4 is a cross-sectional view taken along line IV-IV of FIG. 2.

As illustrated in FIGS. 3, 4, and the like, the lower mechanism 35 includes the rotation drive unit 40 that rotates the upper mechanism 34. As illustrated in FIGS. 2 and 3, the lower mechanism 35 is provided with the push-up force output unit 59 that lifts and lowers the first lifting operation units 43a and 43b and the push-up force output unit 68 that lifts and lowers the second lifting operation units 44a and 44b at predetermined positions. The rotation drive unit 40 includes a direct drive motor or the like having the drive plate 41 that rotates the rotating body 47 of the upper mechanism 34. An opening portion into which the suction pipe 49 is inserted is formed at the center portion of the rotation drive unit 40.

The push-up force output units 59 and 68 are disposed at positions facing a pair of the first lifting operation unit 43 and the second lifting operation unit 44 disposed on both side portions in the X direction in FIGS. 6 and 8, respectively. Even when the upper mechanism 34 is rotationally driven by the rotation drive unit 40 by 180 degrees, the push-up force output unit 59 faces the transmission member (roller member) 57 of the first lifting operation unit 43, and the push-up force output unit 68 faces the transmission member (roller member) 67 of the second lifting operation unit 44. Air tubes 16 and 17 are connected to the air cylinders 56 and 65 that lift and lower the push-up force output units 59 and 68, respectively (see FIG. 5).

The inspection target 100 may be, for example, various boards such as a glass epoxy board, a flexible board, a ceramic multilayer circuit board, an electrode plate for use in a liquid crystal display or a plasma display, a transparent conductive plate for use in a touch panel, a package board for use in a semiconductor package, and a film carrier.

Figure 10:
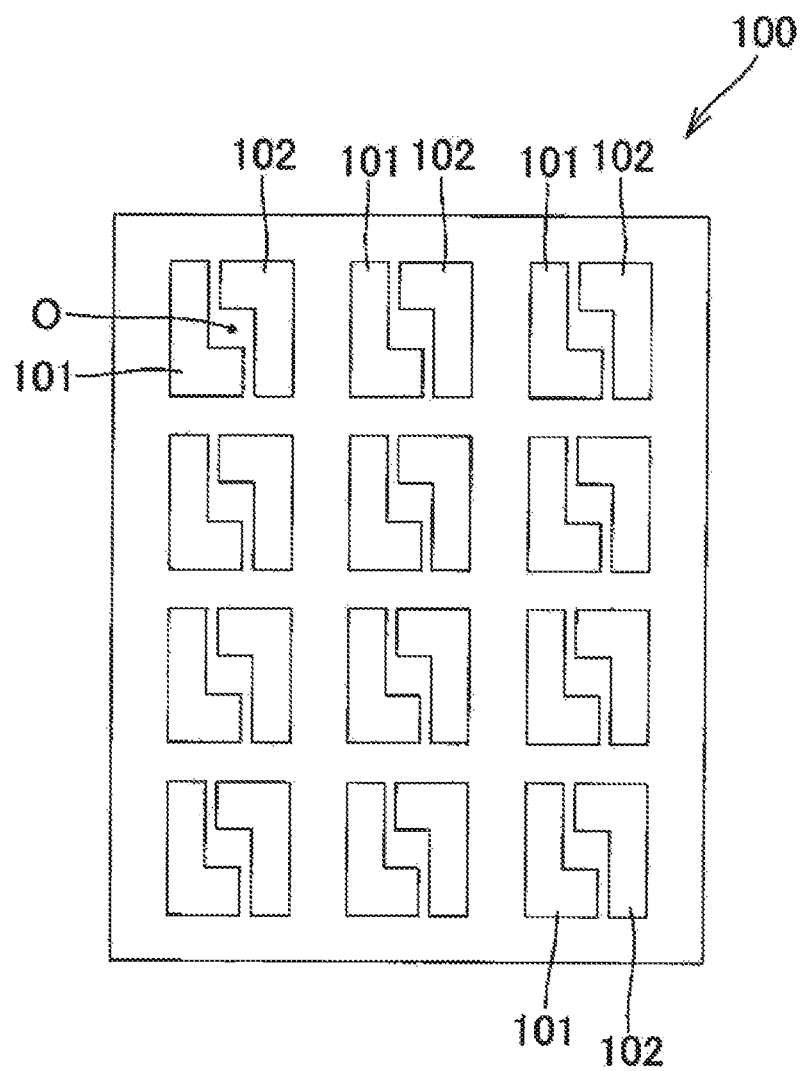
FIG. 10 is a plan view illustrating a specific configuration of an inspection target.

In the inspection target 100, as illustrated in FIG. 10, a plurality of first unit substrates 101 in which the wiring directions are arranged in the forward direction and a plurality of second unit substrates 102 in which the wiring directions are arranged in the reverse direction are arranged to face each other. The first unit substrate 101 and the second unit substrate 102 are formed in a point-symmetric figure centered on the point O in a plan view of the inspection target 100.

Figure 11:
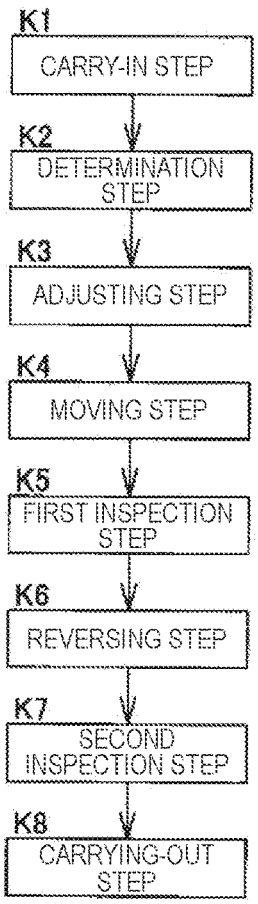
FIG. 11 is a process diagram illustrating a control operation of a control unit.

A control operation when the inspection device 1 having the above-described configuration inspects the inspection target 100 will be described based on a process diagram illustrated in FIG. 11. First, in a carry-in step K1, the control unit 6 operates the conveyance mechanism 4 or the like to take out the inspection target from the supply cassette, convey the inspection target 100 onto the placement table 2, and place the inspection target on the placement surface 36 of the table 33.

Specifically, as illustrated in FIGS. 3 and 6, the control unit 6 executes control to push up the pressing member 53 of the first lifting operation units 43a and 43b to the raised position U1. In addition, the control unit 6 performs control to push up the upper ends of the protruding rods 63 of the second lifting operation units 44a and 44b to the push-up position U2. Next, the control unit 6 performs control to operate the conveyance mechanism 4 to convey the inspection target 100 above the protruding rod 63. Thereafter, the control unit 6 lowers the inspection target holding portion 10 of the conveyance mechanism 4 to transfer the inspection target 100 from the inspection target holding portion 10 onto the upper end of the protruding rod 63. Further, the control unit 6 controls the inspection target holding portion 10 to be lowered to the retracted position from the upper end of the protruding rod 63 and then retracted from below the inspection target 100.

Then, the control unit 6 executes control to press the pressing member 53 to the pressing position S1. As a result, as illustrated in FIG. 8, the end of the inspection target 100 placed on the placement surface 36 of the table 33 is pressed against the placement surface 36 by the pressing member 53. The control unit 6 executes control to push down the upper end of the protruding rod 63 to the retracted position S2 below. As a result, as illustrated in FIG. 8, the upper end of the protruding rod 63 is retracted downward from the placement surface 36 of the table 33. Next, the control unit 6 operates a vacuum device (not illustrated) to suck air through the suction pores and perform control to adsorb the inspection target 100 to the placement surface 36.

Next, in a determination step K2, the control unit 6 performs control to determine whether the placement position of the inspection target 100 placed on the placement surface 36 of the placement table 2 is appropriate based on detection signals from the alignment camera 37 and the laser displacement meter 38. In an adjusting step K3, the control unit 6 operates the first moving mechanism 13, the second moving mechanism 14, and the third moving mechanism 15 based on the determination result. The control unit 6 operates the rotation drive unit 40 as necessary. As a result, fine adjustment of the placement position, the placement angle, and the like of the inspection target 100 is performed.

Next, in a moving step K4, the control unit 6 outputs an operation command signal to the second moving mechanism 14, and executes control to move the placement table 2 to the inspection unit 5. Thereafter, in a first inspection step K5, the control unit 6 brings the probe Pr into contact with an inspected portion of the inspection target 100 to inspect the inspection target 100.

When all the inspection of the first unit substrate 101 is completed, in a reversing step K6, the rotation drive unit 40 of the lower mechanism 35 is operated to rotate the upper mechanism 34 by 180 degrees. As a result, the direction of the inspection target 100 placed on the table 33 is reversed in a plan view. Thereafter, in a second inspection step K7, the control unit 6 brings the probe Pr into contact with the inspected portion of the inspection target 100 to inspect the inspection target 100.

At the point of time when all the inspection of the inspection target 100 is completed as described above, the control unit 6 performs control to take out the inspection target from the placement table 2 and carry out the inspection target 100 to an installation portion of a storage cassette in a carrying-out step K8. Specifically, the control unit 6 outputs a control signal for operating the second moving mechanism 14 to move the placement table 2 from the inspection unit 5 to the original position illustrated in FIG. 1. As illustrated in FIG. 3, the control unit 6 performs control to raise the pressing member 53 of the first lifting operation unit 43 and the protruding rod 63 of the second lifting operation unit 44. As a result, the inspection target 100 is pushed up above the placement surface 36 by the protruding rod 63.

Next, the control unit 6 causes the inspection target holding portion 10 to enter between the placement surface 36 and the inspection target 100, and then performs control to raise the inspection target holding portion 10. As a result, the inspection target 100 is transferred from the upper end of the protruding rod 63 onto the inspection target holding portion 10. Then, the control unit 6 operates the conveyance mechanism 4 to carry out the inspection target 100 from the placement table 2 to the installation portion of the storage cassette and to store the inspection target in the storage cassette.

The above-described inspection device 1 includes the placement table 2 separated into the upper mechanism 34 including the table 33 provided with the placement surface 36 of the inspection target 100 and the lower mechanism 35 that rotatably supports the upper mechanism 34. The first and second lifting operation units 43 and 44 are supported by the upper mechanism 34 so as to be movable up and down. On the other hand, the lower mechanism 35 is provided with the rotation drive unit 40 that rotates the upper mechanism 34, and the push-up force output units 56 and 65 that lift and lower the first and second lifting operation units 43 and 44.

According to the above configuration, at the time of inspection of the inspection target 100, the inspection target 100 supported by the upper mechanism 34 can be rotated in a plan view without applying a large load to the rotation drive unit 40. Therefore, for example, as illustrated in FIG. 10, even in a case where the plurality of first unit substrates 101 and the plurality of second unit substrates 102 provided on the inspection target 100 are formed in point-symmetrical figures, these inspections can be easily and appropriately performed.

That is, the rotation drive unit 40 including a direct drive motor or the like having a large weight and the air cylinders 56 and 65 that lift and lower the push-up force output units 59 and 68 are provided in the lower mechanism 35. Therefore, the weight of the upper mechanism 34 can be reduced, and the upper mechanism 34 can be easily rotated with a light force. Therefore, the first unit substrate 101 and the second unit substrate 102 can be easily and appropriately inspected.

The tips of the push-up force output units 59 and 68 provided in the lower mechanism 35 are installed so as to be able to contact or separate from the transmission members 57 and 67 provided at the lower ends of the first and second lifting operation units 43 and 44. By bringing the tips of the push-up force output units 59 and 68 into contact with the transmission members 57 and 67, the first and second lifting operation units 43 and 44 can be lifted and lowered. When the upper mechanism 34 is rotated, the tips of the push-up force output units 59 and 68 can be separated from the transmission members 57 and 67. Therefore, the upper mechanism 34 can be rotated with a lighter force.

As a result, the upper mechanism 34 to be driven by the rotation drive unit 40 is provided with the first and second lifting operation units 43 and 44, so that the upper mechanism 34 can be enhanced in functionality. Furthermore, since the air cylinders 56 and 65 that drive the first and second lifting operation units 43 and 44 are provided in the lower mechanism 35 without being provided in the upper mechanism 34, an increase in weight of the upper mechanism 34 can be reduced. Therefore, it is easy to reduce the possibility of an increase in the load of the rotation drive unit 40 due to an increase in weight while achieving high functionality of the upper mechanism 34 driven by the rotation drive unit 40.

In the above embodiment, the rotary joint 50 is provided at the lower end of the suction pipe 49, and the suction force of the vacuum device (not illustrated) is applied via the pipe 19 connected to the rotary joint 50. Therefore, the rotational force when rotating the support plate 45 of the upper mechanism 34 to which the upper end of the suction pipe 49 is attached can be absorbed by the rotary joint 50.

In the above-described embodiment, when the rotation angle of the upper mechanism 34 with respect to the lower mechanism 35 is a preset setting angle, the first and second lifting operation units 43 and 44 are disposed at positions facing the push-up force output units 59 and 68. The tips of the push-up force output units 59 and 68 are in contact with the transmission members 57 and 67 made of a roller member or the like formed of a material harder than the lower surface of the upper mechanism 34, so that each of the first and second lifting operation units 43 and 44 are operated. Therefore, when the upper mechanism 34 is rotationally driven at a predetermined setting angle, each of the first and second lifting operation units 43 and 44 operates appropriately. In addition, when the tips of the push-up force output units 59 and 68 are brought into contact with the transmission members 57 and 67, it is possible to prevent the transmission members 57 and 67 from being deformed. When the tips of the push-up force output units 59 and 68 are brought into contact with the transmission members 57 and 67 made of a roller member or the like to raise the transmission members 57 and 67, there is a possibility that the transmission members 57 and 67 rotate. Therefore, it can be preferable to provide a regulating mechanism that regulates the rotation of the transmission members 57 and 67 by electromagnetic force when the transmission members 57 and 67 are raised.

When the upper mechanism 34 is rotated by 180 degrees in a plan view, the first lifting operation unit 43a and the second lifting operation unit 44a located on the left side in FIG. 3 are located on the right side in FIG. 3. At the same time, the first and second lifting operation units 43b and 44b located on the right side in FIG. 3 are located on the left side in FIG. 3. As a result, the transmission members 57 and 67 provided in the upper mechanism 34 and the push-up force output units 59 and 68 provided in the lower mechanism 35 face each other. Therefore, in the above-described embodiment, when the upper mechanism 34 is rotated by 180 degrees, the first lifting operation units 43a and 43b and the second lifting operation units 44a and 44b can be operated to lift and lower the pressing member 53 and the protruding rod 63.

Figure 12:
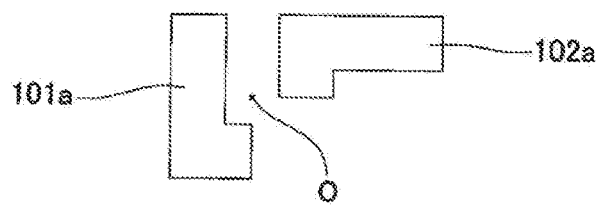
FIG. 12 is a plan view illustrating a modification of a unit substrate disposed in the inspection target.
Figure 13:
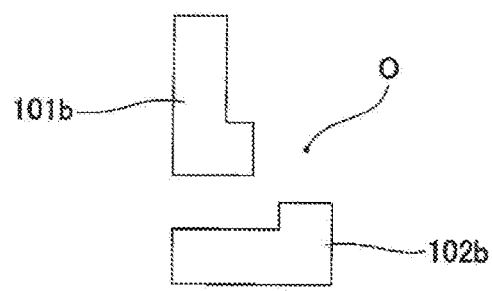
FIG. 13 is a plan view illustrating another modification of the unit substrate disposed in the inspection target.

The four first and second lifting operation units 43 and 44 may be disposed at four positions facing each other in a plan view of the upper mechanism 34. According to this configuration, as illustrated in FIG. 12, in a case where a first unit substrate 101a and a second unit substrate 102a are arranged at a rotation angle of 90 degrees about the point O, this inspection can be easily and appropriately performed. As illustrated in FIG. 13, even in a case where a first unit substrate 101b and a second unit substrate 102b are arranged at a rotation angle of 270 degrees about the point O, these inspections can be easily and appropriately performed.

In the above-described embodiment, the transmission members 57 and 67 are constituted by roller members rotatably supported around the shafts 58 and 66 provided at the lower ends of the first and second lifting operation units 43 and 44. The tips of the push-up force output units 59 and 68 facing the transmission members 57 and 67 are formed on the flat surfaces 60 and 69 extending in a direction orthogonal to the lifting direction of the first and second lifting operation units 43 and 44. Therefore, there is an advantage that it is easy to rotate the table 33 of the upper mechanism 34 even in a state where the inspection target 100 is pressed against the placement surface by the pressing member 53 of the first lifting operation unit 43.

That is, when it is confirmed that there is a slight deviation in a placement angle θ of the inspection target 100 in plan view according to the detection signals of the alignment camera 37 and the laser displacement meter 38, it can be necessary to rotate the upper mechanism 34 by a small angle by the rotation drive unit 40 in order to correct the deviation. In this case, by rotating the transmission members 57 and 68, the upper mechanism 34 can be smoothly rotated without generating a large frictional force.

In the above-described embodiment, the pressing member 53 that is pushed up to the raised position U1 above the placement surface 36 of the table 33 when the tip of the push-up force output unit 59 comes into contact with the transmission member 57 is provided in the first lifting operation unit 43. The biasing member 55 that pushes down the pressing member 53 to the pressing position S1 on the lower side when the tip of the push-up force output unit 59 is separated from the transmission member 57 is provided in the first lifting operation unit 43. Therefore, at the time of inspection of the inspection target 100, the pressing member 53 can be quickly and smoothly lowered to the pressing position S1 according to the biasing force of the biasing member 55. Therefore, even when the end portion of the inspection target 100 is warped, the end portion of the inspection target 100 is pressed against the placement surface 36 via the pressing member 53, so that the warpage of the inspection target 100 can be appropriately corrected.

That is, depending on the material of the inspection target 100, warpage may easily occur in the inspection target 100, and the warpage may occur such that the end portion is separated from the placement surface 36 than the central portion of the inspection target 100. In such a case, when the pressing member 53 is pressed down to the pressing position K1 on the lower side at the time of inspection of the inspection target 100, the warpage of the inspection target 100 can be effectively corrected using the pressing force of the pressing member 53. In addition, after the inspection of the inspection target 100 is completed, the pressing member 53 is raised to the raised position U1 above the placement surface 36 of the inspection target 100, so that the carrying-out work of the inspection target 100 can be easily performed.

In the above embodiment, when the inspection target 100 is conveyed and placed on the placement surface 36 by the conveyance mechanism 4, the upper end of the protruding rod 63 of the second lifting operation unit 44 protrudes upward from the placement surface 36. As a result, it is possible to easily perform the work of transferring the inspection target 100 from the inspection target holding portion 10 onto the protruding rod 63. After the conveyance work of the inspection target 100 is completed, the upper end of the protruding rod 63 is retracted downward from the placement surface 36, so that the inspection target 100 can be placed on the placement surface 36.

The inspection device 1 according to the above-described embodiment includes the placement table 2 having the above-described configuration, the conveyance mechanism 4 that conveys the inspection target 100, the control unit 6 that controls the push-up force output units 59 and 68 and the conveyance mechanism 4, and the inspection unit 5 that inspects the inspection target 100 placed on the placement surface 36. The conveyance mechanism 4 is provided with the inspection target holding portion 10 that holds the inspection target 100. The control unit 6 is configured to operate the push-up force output unit 68 to cause the upper end of the protruding rod 63 to protrude to the push-up position U2, operate the conveyance mechanism 4 to cause the inspection target 100 to be held by the inspection target holding portion 10, convey the inspection target 100 above the placement surface 36 to place the inspection target holding portion 10 on the upper end of the protruding rod 63, retract the inspection target holding portion 10 from below the inspection target 100, and stop the operation of the push-up force output unit 68 to lower the upper ends of the plurality of protruding rods 63 to the retracted position S2 to place the inspection target 100 on the placement surface.

According to this configuration, at the time of inspection of the inspection target 100, the work of transferring the inspection target 100 conveyed on the placement surface 36 by the conveyance mechanism 4 from the inspection target holding portion 10 onto the protruding rod 63, the work of placing the inspection target 100 on the placement surface 36, and the work of retracting the inspection target holding portion 10 from below the inspection target 100 can be easily performed.

As described above, an inspection device according to an exemplary embodiment of the present disclosure includes an upper mechanism including a table on which a placement surface of the inspection target is provided, a lower mechanism that rotatably supports the upper mechanism, and a lifting operation unit supported by the upper mechanism so as to be movable up and down. The lower mechanism includes a rotation drive unit that rotates the upper mechanism, and a push-up force output unit that is aligned so as to face the lifting operation unit and lifts and lowers the lifting operation unit, the lifting operation unit is disposed at a position facing the push-up force output unit when a rotation angle of the upper mechanism with respect to the lower mechanism is a preset setting angle, and a transmission member with which a tip of the push-up force output unit can contact or separate is provided at a lower end of the lifting operation unit.

According to this configuration, the upper mechanism is rotationally driven by the rotation drive unit. The lifting operation unit that is lifted and lowered by the push-up force output unit is provided in the upper mechanism. That is, the upper mechanism to be driven by the rotation drive unit is enhanced in function. On the other hand, since the push-up force output unit that lifts and lowers the lifting operation unit is provided in the lower mechanism, the weight of the upper mechanism can be reduced. As a result, it is easy to reduce the possibility of an increase in the load on the rotation drive unit due to an increase in weight while achieving high functionality of the drive target driven by the rotation drive unit. By bringing the tip of the push-up force output unit into contact with the transmission member in a state where the push-up force output unit is aligned so as to face the lifting operation unit, the lifting operation unit can be lifted and lowered. Therefore, the upper mechanism provided with the lifting operation unit can be easily rotated with a light force to easily change the direction of the inspection target placed on the placement surface.

It may be preferable that a tip of the push-up force output unit can face a lower surface of the upper mechanism, the transmission member is formed of a material harder than the lower surface of the upper mechanism, and the push-up force output unit lifts and lowers the lifting operation unit by a tip thereof coming into contact with the transmission member.

According to this configuration, since the transmission member is formed of a material harder than the lower surface of the upper mechanism, there is an advantage that deformation hardly occurs as compared with a case where the tip of the push-up force output unit is configured to abut on the lower surface of the upper mechanism.

It may be preferable that the transmission member is formed of a roller member rotatably supported around a shaft orthogonal to the lifting direction of the lifting operation unit, and a tip of the push-up force output unit is formed in a plane extending in a direction orthogonal to the lifting direction of the lifting operation unit.

According to this configuration, by rotating the upper mechanism in a state where the tip of the push-up force output unit is in contact with the transmission member including the roller member, it is possible to easily perform an operation of finely adjusting the placement angle of the inspection target placed on the placement surface, and the like.

It is desirable that the lifting operation unit include a pressing member that is pushed up to a raised position above the placement surface by the push-up force output unit when the tip of the push-up force output unit comes into contact with the lifting operation unit, and a biasing member that pushes down the pressing member to a pressing position below the raised position when the tip of the push-up force output unit is separated from the lifting operation unit.

According to this configuration, when the pressing member is pressed down to the pressing position according to the biasing force of the biasing member in a state where the inspection target is placed on the placement surface, the end portion of the inspection target is pressed toward the placement surface. As a result, the inspection target is inspected in a state where the inspection target is stably placed on the placement surface.

The lifting operation unit may include a protruding rod whose upper end is pushed up to a push-up position above the placement surface when a tip of the push-up force output unit comes into contact with the lifting operation unit, and a biasing member that pushes down the upper end of the protruding rod to a retracted position below the placement surface when the tip of the push-up force output unit is separated from the lifting operation unit.

According to this configuration, when the inspection target is placed on the placement surface, the upper end of the protruding rod protrudes upward from the placement surface, whereby the work of transferring the inspection target onto the upper end of the protruding rod can be easily performed. The inspection target can be placed on the placement surface by retracting the upper end of the protruding rod downward from the placement surface.

The inspection device further includes a conveyance mechanism that conveys the inspection target, a control unit that controls the push-up force output unit and the conveyance mechanism, and an inspection unit that inspects the inspection target placed on the placement surface. The conveyance mechanism includes an inspection target holding portion that holds the inspection target. The control unit is configured to operate the push-up force output unit to cause the upper end of the protruding rod to protrude to the push-up position, operate the conveyance mechanism to cause the inspection target to be held by the inspection target holding portion, convey the inspection target above the placement surface to place the inspection target holding portion on the upper end of the protruding rod, retract the inspection target holding portion from below the inspection target, and stop the operation of the push-up force output unit to lower the upper ends of the plurality of protruding rods to the retracted position to place the inspection target on the placement surface.

According to this configuration, by operating the push-up force output unit and the conveyance mechanism according to the control signal output from the control unit, at the time of inspection of the inspection target, the work of transferring the inspection target conveyed on the placement surface via the conveyance mechanism from the inspection target holding portion onto the protruding rod, the work of placing the inspection target on the placement surface, and the work of retracting the inspection target holding portion from below the inspection target can be easily performed.

Features of the above-described embodiments and the modifications thereof may be combined appropriately as long as no conflict arises.

While embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection device comprising:
an upper mechanism including a table provided with a placement surface of an inspection target;
a lower mechanism configured to rotatably support the upper mechanism; and
a lifting operation unit configured to be supported by the upper mechanism so as to be movable up and down, wherein
the lower mechanism includes:
a rotation drive unit configured to rotate the upper mechanism; and
a push-up force output unit aligned so as to face the lifting operation unit and configured to lift and lower the lifting operation unit,
the lifting operation unit is disposed at a position facing the push-up force output unit when a rotation angle of the upper mechanism with respect to the lower mechanism is a preset setting angle, and
a transmission member with which a tip of the push-up force output unit can contact or separate is provided at a lower end of the lifting operation unit.

2. The inspection device according to claim 1, wherein
a tip of the push-up force output unit can face a lower surface of the upper mechanism,
the transmission member is formed of a material harder than the lower surface of the upper mechanism, and
the push-up force output unit is configured to lift and lower the lifting operation unit when the tip of the push-up force output unit comes into contact with the transmission member.

3. The inspection device according to claim 2, wherein
the lifting operation unit includes:
a pressing member configured to be pushed up to a raised position above the placement surface by the push-up force output unit when the tip of the push-up force output unit comes into contact with the lifting operation unit; and
a biasing member configured to push down the pressing member to a pressing position below the raised position when the tip of the push-up force output unit is separated from the lifting operation unit.

4. The inspection device according to claim 2, wherein
the lifting operation unit includes:
a protruding rod whose upper end is pushed up to a push-up position above the placement surface when the tip of the push-up force output unit comes into contact with the lifting operation unit; and
a biasing member configured to push down the upper end of the protruding rod to a retracted position below the placement surface when the tip of the push-up force output unit is separated from the lifting operation unit.

5. The inspection device according to claim 2, wherein
the transmission member includes a roller member rotatably supported around a shaft orthogonal to a lifting direction of the lifting operation unit, and
the tip of the push-up force output unit is formed in a plane extending in a direction orthogonal to the lifting direction of the lifting operation unit.

6. The inspection device according to claim 5, wherein
the lifting operation unit includes:
a pressing member configured to be pushed up to a raised position above the placement surface by the push-up force output unit when the tip of the push-up force output unit comes into contact with the lifting operation unit; and
a biasing member configured to push down the pressing member to a pressing position below the raised position when the tip of the push-up force output unit is separated from the lifting operation unit.

7. The inspection device according to claim 5, wherein
the lifting operation unit includes:
a protruding rod whose upper end is pushed up to a push-up position above the placement surface when the tip of the push-up force output unit comes into contact with the lifting operation unit; and
a biasing member configured to push down the upper end of the protruding rod to a retracted position below the placement surface when the tip of the push-up force output unit is separated from the lifting operation unit.

8. The inspection device according to claim 1, wherein the lifting operation unit includes:
   a pressing member configured to be pushed up to a raised position above the placement surface by the push-up force output unit when the tip of the push-up force output unit comes into contact with the lifting operation unit; and
   a biasing member configured to push down the pressing member to a pressing position below the raised position when the tip of the push-up force output unit is separated from the lifting operation unit.

9. The inspection device according to claim 8, wherein the lifting operation unit includes:
   a protruding rod whose upper end is pushed up to a push-up position above the placement surface when the tip of the push-up force output unit comes into contact with the lifting operation unit; and
   a biasing member configured to push down the upper end of the protruding rod to a retracted position below the placement surface when the tip of the push-up force output unit is separated from the lifting operation unit.

10. The inspection device according to claim 1, wherein the lifting operation unit includes:
    a protruding rod whose upper end is pushed up to a push-up position above the placement surface when the tip of the push-up force output unit comes into contact with the lifting operation unit; and
    a biasing member configured to push down the upper end of the protruding rod to a retracted position below the placement surface when the tip of the push-up force output unit is separated from the lifting operation unit.

11. The inspection device according to claim 10, further comprising:
    a conveyance mechanism configured to convey the inspection target;
    a control unit configured to control the push-up force output unit and the conveyance mechanism; and
    an inspection unit configured to inspect the inspection target placed on the placement surface, wherein
    the conveyance mechanism includes an inspection target holding portion configured to hold the inspection target,
    the control unit is configured to execute:
    control in which the push-up force output unit is operated to cause the upper end of the protruding rod to protrude to the push-up position;
    control in which the conveyance mechanism is operated to cause the inspection target to be held by the inspection target holding portion;
    control in which the inspection target is conveyed above the placement surface to be placed on the upper end of the protruding rod, and control in which the inspection target holding portion is retracted from below the inspection target; and
    control in which the operation of the push-up force output unit is stopped to lower the plurality of protruding rods to the retracted position to place the inspection target on the placement surface.

* * * * *